United States Patent [19]
Hawkins et al.

[11] Patent Number: 5,711,890
[45] Date of Patent: Jan. 27, 1998

[54] METHOD FOR FORMING CYLINDRICAL LENS ARRAYS FOR SOLID STATE IMAGER

[75] Inventors: Gilbert Alan Hawkins, Mendon; Madhav Mehra; Christopher Parks, both of Rochester, all of N.Y.

[73] Assignee: Eastman Kodak Company, Rochester, N.Y.

[21] Appl. No.: 613,306

[22] Filed: Mar. 11, 1996

[51] Int. Cl.⁶ .................................................. H01L 27/14
[52] U.S. Cl. .......................... 216/24; 216/26; 216/38; 216/39; 257/432; 257/436; 257/440; 257/443
[58] Field of Search .................................. 216/24, 26, 38, 216/39; 257/432, 436, 440, 443

[56] References Cited

U.S. PATENT DOCUMENTS

| | | | |
|---|---|---|---|
| 4,553,153 | 11/1985 | McColgin et al. | 357/30 |
| 4,667,092 | 5/1987 | Ishihara | 250/216 |
| 4,694,185 | 9/1987 | Weiss | 250/578 |
| 4,966,831 | 10/1990 | Mehra et al. | 430/321 |
| 5,293,267 | 3/1994 | Nakai | 359/619 |
| 5,306,926 | 4/1994 | Yonemoto | 257/432 |
| 5,321,249 | 6/1994 | Nomura | 250/208 |
| 5,321,297 | 6/1994 | Enomoto | 257/432 |
| 5,324,930 | 6/1994 | Jech, Jr. | 250/216 |
| 5,371,397 | 12/1994 | Maegawa et al. | 257/432 |

*Primary Examiner*—Mark Chapman
*Attorney, Agent, or Firm*—Raymond L. Owens

[57] ABSTRACT

A method of making an imager includes the following steps: providing a semiconductor substrate having a top surface; providing a plurality of spaced image pixels h the substrate, thereby forming a semiconductor portion; and depositing a first transparent substantially inorganic support layer over the semiconductor portion. The method further includes the following steps: making the inorganic support layer optically planar by chemical mechanical polishing, thereby forming an optically flat top surface; forming a plurality of depressions in the optically flat top surface; uniformly depositing a substantially inorganic lens material on the optically flat top surface, entirely filling the depressions; and making the substantially inorganic lens material optically planar by chemical mechanical polishing, thereby forming an optically planar lens surface.

5 Claims, 10 Drawing Sheets

METHOD FOR FORMING CYLINDRICAL LENS ARRAYS FOR SOLID STATE IMAGER

CROSS REFERENCE TO RELATED APPLICATION

Reference is made to commonly assigned and concurrently filed U.S. application Ser. No. 08/613,877, entitled "Method for Forming Inorganic Lens Array for Solid State Imagers", by Hawkins et al; U.S. application Ser. No. 08/627,884, entitled "Solid State Imager with Inorganic Lens Array", by Hawkins et al, and U.S. application Ser. No. 08/613,930, entitled "Solid State Imager With Crossed Cylindrical Lens Array", by Hawkins et al, the disclosures of which are incorporated herein by reference.

1. Field of the Invention

This invention relates to a method of making solid state imagers with integral lens arrays, and more particularly to a method of making imagers having two arrays of cylindrical lenses disposed perpendicularly to one another and to a method of making such imagers.

2. Background of the Invention

A solid state imager can be viewed as being made up of a number of laterally offset pixels containing photosensitive regions. Lens arrays placed in registration with the pixels of a solid state imager are well known to the art and can take a variety of forms. Each lens concentrates incident light into an associated pixel of the imager in order to optimize device performance by increasing light sensitivity. Interline imagers, in which the photosensitive region (photodiode) occupies only part of each pixel, particularly benefit from lens arrays, as is well known in the art. FIG. 1 shows a single image pixel 10 of a typical interline imager in registration with a lens 22, a photodiode 14 formed in a semiconductor substrate 12, a gate electrode 16, and a light shield 18. The gate electrode 16 and light shield 18 are typically isolated electrically from one another and from the semiconductor substrate 12 by isolation oxides, not shown. A lens array includes a plurality of lenses 22. The photodiode 14, the semiconductor substrate 12, the gate electrode 16, and the light shield 18 form a semiconductor portion 40 of the imager.

Lens arrays integral to the imager are commonly made by thermal deformation of photolithographically defined polymers, such as photoresist, as taught for example by Ishihara, U.S. Pat. No. 4,667,092 for the case of cylindrically shaped lens arrays, or Weiss, U.S. Pat. No. 4,694,185 for the case of rectangular lens arrays.

Referring again to FIG. 1, the device shown has a lens supporting layer 20 for offsetting the lens array from the photodiode 14 to maximize collection of light in the photodiode 14. Conventionally, the lens supporting layer 20 includes at least one organic or inorganic spacer layer which provides some degree of planarization. It is desirable that all light rays incident on single pixel 10 be directed to photodiode 14. In practice, however, some rays do not reach photodiode 14. A blocked light ray 30 that is not collected by the photodiode 14 is shown.

Referring now to FIGS. 2A and 2B, the lens supporting layer 20 can include an upper spacer layer 20a and a lower spacer layer 20b. A color filter element 26, as shown in FIG. 2B, can be positioned between the upper spacer layer 20a and the lower spacer layer 20b for the manufacture of color imagers and can thus also be part of the lens supporting layer 20. The use and limitations of such planarization layers in optically active solid state devices is taught by McColgin, U.S. Pat. No. 4,553,153 for a polymerizable monomer. Color filter arrays, such as those described in Nomura, U.S. Pat. No. 5,321,249, are typically coated from organic materials.

Referring again to FIGS. 2A and 2B, to form an array of lenses over the lens supporting layer 20, a coating, typically of photoresist, is exposed on the lens supporting layer 20 and developed to produce an array of rectangular resist islands 28. The resist pattern is then flood exposed to bleach the remaining photochemistry and subsequently heated until the resist material flows enough to form convex lenses 22, yet not so much as to cause adjacent lenses to flow together, as taught in U.S. Pat. No. 4,694,185. Therefore, there must be some spacing between the lenses 22, and as a result, some light is lost.

To fully utilize the available light, all incident light rays desired to be associated with a given pixel must be directed through an associated aperture 24 in the light shield 18 and into or near to the photodiode 14. Because the opening of the aperture 24 is typically made small in order to reduce smear, as is well known in the art, and because of the need for spacing between the lenses 22 as previously noted, it has not been possible to direct all light rays to the photodiode 14. Moreover, the apertures 24 in the light shields 18 are frequently rectangular in shape when viewed from above the imager, whereas the lenses 22 are frequently square when viewed from above the imager, further reducing the number of rays directed to the photodiode 14. Therefore, the sensitivity of the imager is reduced to less than what it might otherwise be.

Referring now to FIGS. 3A and 3B, a prior art lens is shown in top view. FIG. 3A depicts photoresist islands 28 formed from patterning a conventional photoresist, whereas FIG. 3B shows the effects of heating the photoresist islands 28 above the glass transition temperature to reflow the photoresist and thereby provide a curved upper surface, as is well know in the art of lens manufacture for solid state imagers. The square drawn in FIGS. 3A and 3B indicates the pixel size, which is larger than the size of the photoresist islands 28, due to imperfect lithography and to the fact that the lenses must not touch during reflow. Photodiodes 14 of FIGS. 2A and 2B (not shown in FIG. 3) in semiconductor protion 40 (not shown in FIG. 3) lie below the squares drawn in FIGS. 3A and 3B and are typically centered in the squares in FIGS. 3A and 3B as is well known in the art. After reflow of the photoresist, the proximity of two edges of the photoresist islands 28 causes roundling particularly at corner regions 32. This rounding provides for substantial areas around each lens (shading in FIG. 3B) which do not direct rays to the photodiodes 14 (not shown) of the imager, as is well known in the art. Due to the rounding at corner regions 32 of the photoresist islands 28 after reflow and to the gaps between lenses, there are substantial areas which do not direct rays to the photodiodes 14 (not shown), as is well known in the art. The fraction of the corresponding pixel occupied by such areas is large for small pixel sizes. FIG. 3B also shows the location of several blocked light rays 30 incident on the lenses 22 or the lens supporting layer 20 that are not directed to the photodiodes 14 and are therefore wasted.

Various improvements in the structure of the lens array have been directed to increasing the light gathering efficiency by directing a greater portion of the rays into the photodiode 14 of FIGS. 2A and 2B. Enomoto, U.S. Pat. No. 5,321,297, and Nakai, U.S. Pat. No. 5,293,267, teach methods of forming lenses having different curvatures in the directions corresponding to the long and short dimensions of the apertures, thereby increasing the fraction of incident rays directed toward the photodiodes 14. Yonemoto, U.S. Pat. No. 5,306,926, teaches the use of spacer layers and planarizing layers using materials with indices of refraction that assist the direction of rays to the photodiodes 14. Masegawa, U.S. Pat. No. 5,371,397, shows a variety of light beam dispersion structures, as well as the use of layers having deliberately adjusted indices of refraction to better collimate rays entering the photodiode, thereby reducing smear. Other improvement efforts have been directed to reducing or utilizing the space between lenses. For example, Jech, U.S. Pat. No. 5,324,930, laterally offsets the lens array with respect to the photodiodes so that some light falling in the gap between the lenses can be utilized. Revelli et al., commonly assigned U.S. application Ser. No. 08/369,235 filed Jan. 6, 1995, discloses techniques for making lenses with smaller gaps.

Despite these improvements, it is still not possible to direct all incident rays through the apertures 24 (FIGS. 2A and 2B) and into the photodiodes 14, and thus increased sensitivity of the imagers is still required. This is particularly the case for small pixels, due to the small size of the apertures 24 and to the comparatively larger fraction of area of the lens array occupied by the gaps between the lenses 22. Furthermore, the art has encountered difficulties in stability of the organic materials, which must be subjected to temperatures sufficient to flow the material, but which must remain substantially transparent. Mehra et at., U.S. Pat. No. 4,966,831, teaches methods of protecting the lenses from oxidation, but these methods require additional fabrication steps.

A further difficulty encountered in the art is that the choice of indices of refraction of common polymeric substantially inorganic lens materials is limited to values not too different than that of glass, thereby making overcoating of the lenses with polymeric materials for protection and for packaging difficult, since the refraction of light rays depends on the difference of the indices of the materials at the lens surface. In addition, as typically practiced, the upper lens surfaces are not conducive to further device processing because they are not planar, and therefore, not optimal for subsequent photolithography.

Yet another difficulty encountered in the art is that polymeric substantially inorganic lens materials cannot be heated excessively, for example, to temperatures common in device testing or in instrument sterilization, without changes in lens shape or optical absorption. U.S. Pat. No. 5,321,297 teaches the transfer of the shape of a polymeric lens array fabricated on an inorganic lens layer to that layer by means of an isotropic etch having the same etch rate for the polymeric lens array material as for the inorganic lens layer material. While this method can produce lens arrays that can be heated and for which the selection of material with a wider range of optical properties is possible, the etch is difficult to control in practice and is not widely used in the art. In addition, this method does not solve the loss of optical collection efficiency due to gaps between lenses.

Finally, the methods currently practiced suffer difficulty in process control for devices of different sizes and suffer some loss of optical efficiency because the methods of achieving planarity are imperfect. The shape of upper and lower spacer layers 20a and 20b and of color filter elements 26 in FIGS. 2A and 2B is difficult to control because of the topography of electrodes 16 and light shields 18, especially using a common process for devices of different lateral sizes.

SUMMARY OF THE INVENTION

Accordingly, it is object of this invention to provide lens arrays for solid state imagers in which an increased fraction of light rays are directed to the photodiodes.

This object is achieved in a method of making an imager, comprising the steps of:
(a) providing a semiconductor substrate having a top surface;
(b) providing a plurality of spaced image pixels in the substrate, thereby forming a semiconductor portion;
(c) depositing a first transparent substantially inorganic support layer over the semiconductor portion;
(d) making the inorganic support layer optically planar by chemical mechanical polishing, thereby forming an optically flat top surface;
(e) forming a plurality of depressions in the optically flat top surface;
(f) uniformly depositing a substantially inorganic lens material on the optically flat top surface, entirely filling the depressions;
(g) making the substantially inorganic lens material optically planar by chemical mechanical polishing, thereby forming an optically planar lens surface;
(h) uniformly depositing a low melting glass layer on the optically planar lens surface;
(i) patterning the low melting glass layer into narrowly spaced strips; and
(j) reflowing the narrowly spaced strips by heating the entire structure to form convex cylindrical lenses.

ADVANTAGES

An imager made according to this invention provides an imager with increased device sensitivity by increasing the fraction of incident rays directed to the photodiodes.

An imager made according to this invention provides an imager with optically planar surfaces which reduce unwanted light refraction and facilitates device fabrication.

An imager made according to this invention provides an imager in which the loss of light is reduced by reducing the gaps between the lenses.

An imager made according to this invention further provides an imager in which the gaps between the lenses can be smaller than the minimum photolithographic feature size.

An imager made according to this invention further provides an imager in which layers other than air can be present over the top surface of the lens array.

An imager made according to this invention further provides an imager in which the materials can be chosen so as to be resistant to heat treatments during and after device fabrication.

DETAILED DESCRIPTION OF THE PREFERRED EMBODIMENTS

Figure 4A:
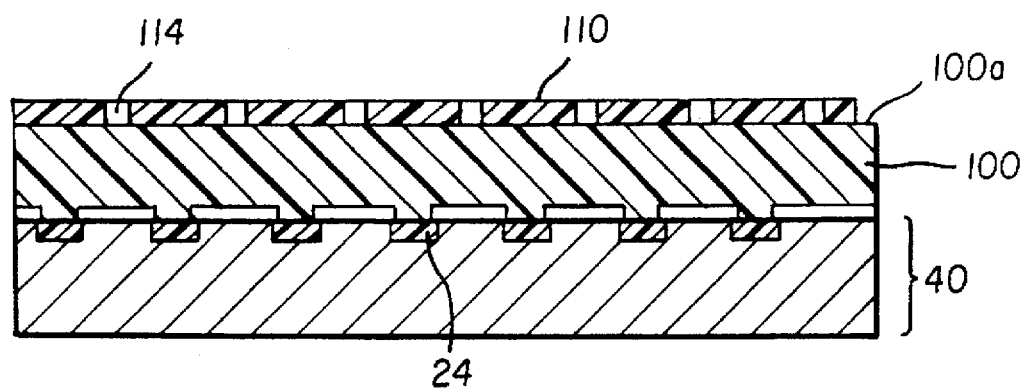
FIGS. 4A–4F are schematic cross-sectional and top views of a solid state imager made in accordance with this invention in which the lenses lie in a planar array of half cylinders and are spatially substantially contiguous.

Where parts or elements correspond to FIG. 1, FIGS. 2A and 2B, and FIGS. 3A and 3B, the same numerals will be used. Referring to FIGS. 4A through 4F, a first embodiment of the present invention is shown in which the lenses are cylindrical and the top surface of each lens is optically planar so as to refract light rays at the top surface in the manner expected for an ideal, flat dielectric. The cylindrical lenses of this embodiment are substantially contiguous with one another. Referring to FIG. 4A, a schematic cross-sectional view of a semiconductor portion 40 of the solid state imager is shown. A transparent substantially inorganic support layer 100, preferably oxide, is deposited over the active semiconductor portion 40, which serves a similar function to lens supporting layer in FIG. 1, in order to provide a surface on which to subsequently form lenses. The surface of the transparent substantially inorganic support layer 100 is then planarized, preferably by chemical mechanical polishing, to form an optically flat surface 100a, which does not refract light away from the semiconductor portion 40 other than in a manner expected of an ideal planar dielectric.

Figure 4B:
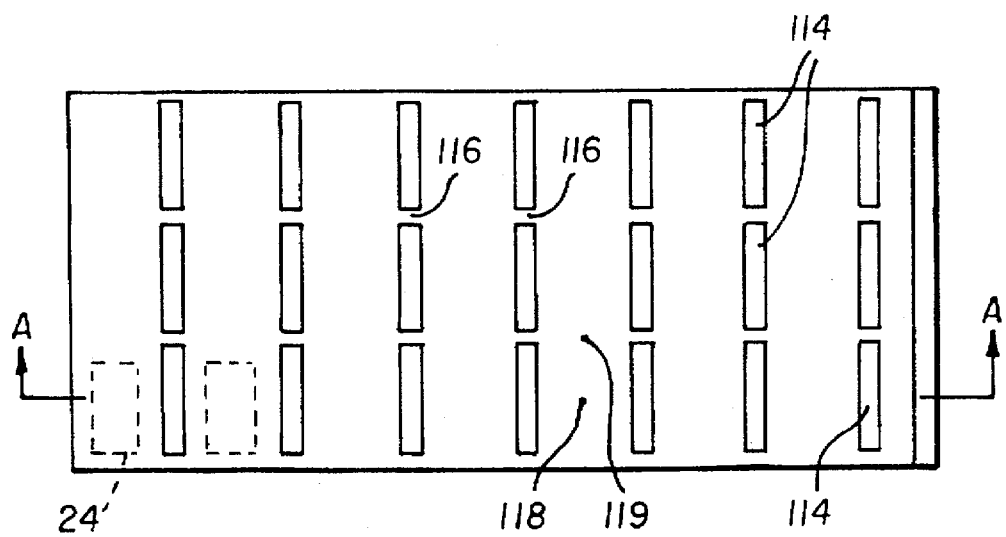

Referring again to FIG. 4A, an etch-stop layer 110, preferably nitride, is deposited on the optically flat surface 100a. A photoresist layer (not shown) is used to pattern isolated openings 114 in the etch-stop layer 110 (as shown in FIG. 4B) in registry with the semiconductor portion 40. The location of apertures 24 in semiconductor portion 40 is shown by the dotted lines in top view FIG. 4B. FIGS. 4A and 4B also show bridge sections 116 of the etch-stop layer 110, preferably defined in registry with the semiconductor portion 40 so that the spacing between adjacent bridge sections 116 is the same as the size of the corresponding pixel. Bridge sections 116 serve to anchor adjacent strips of the etch-stop layer 110 during subsequent etching of the transparent substantially inorganic support layer 100 when the etch-stop layer 110 is substantially undercut. Central regions 118 lie midway between isolated openings 114 and midway between bridge sections 116.

Figure 4C:
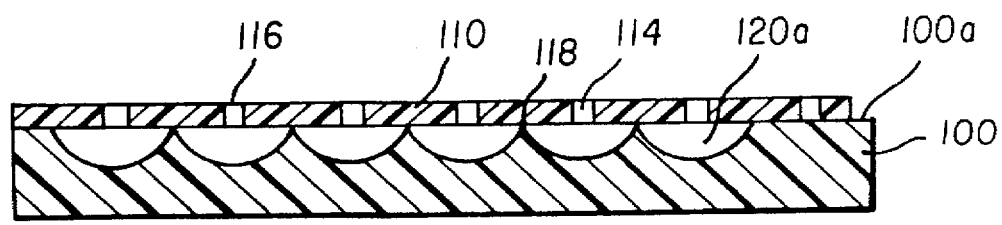

Referring now to FIG. 4C, which is a cross-section AA of FIG. 4B, the transparent substantially inorganic support layer 100 is then subjected to a substantially isotropic etch which may be wet or dry, to provide depressions 120. The depressions 120 are substantially contiguous, touching one another at the optically flat surface 100a raider central regions 118 of etch-stop layer 110. The depressions 120 will come close to touching, for example closer than a few percent of the size of the pixel, but may not quite touch under regions 119 (FIG. 4B) of the etch-stop layer 110 between horizontally adjacent bridge sections 116, the isotropic etch having been slightly retarded by the bridge sections 116.

Figure 4D:
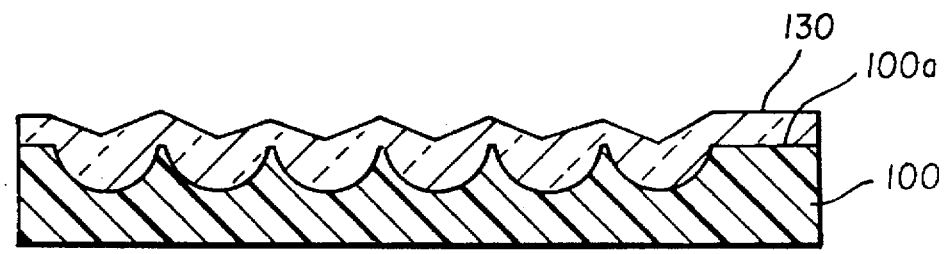
Figure 4E:
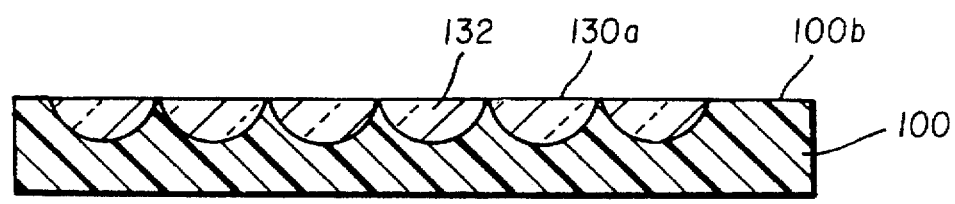
Figure 4F:
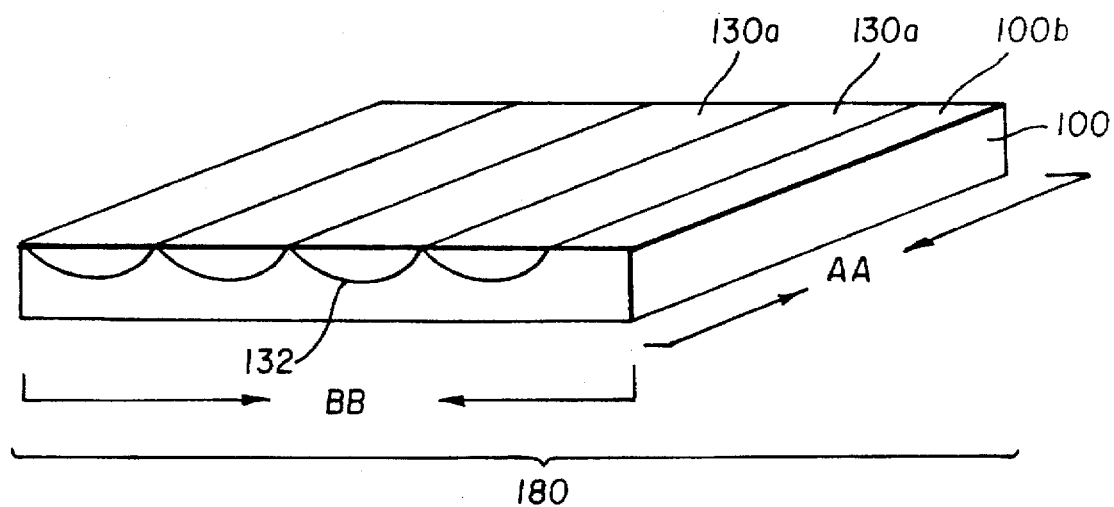

Referring now to FIG. 4D, the etch-stop layer 110 is removed and a substantially inorganic lens material 130 is formed having a refractive index higher than that of the transparent substantially inorganic support layer 100. The substantially inorganic lens material 130 is preferably a transparent substantially inorganic material, and is preferably chosen from the group nitride, titanium oxide, and tantalum oxide and can be deposited by vacuum evaporation or by application and densification of sol-gels. The top of the coating of the substantially inorganic lens material 130 is irregularly formed at this stage. Referring to FIG. 4E, the substantially inorganic lens material 130 is then planarized optically flat, preferably by chemical mechanical polishing, to the extent that the substantially inorganic lens material 130 is removed from the optically flat surface 100a of the transparent substantially inorganic support layer 100 in regions where no depressions 120 were formed, thereby forming lenses 132 having optically flat lens surfaces 130a. The lenses 132 are inverted from the prior art lenses FIGS. 1, 2A and 2B because the topes of lenses 132 are flat. The lenses 132 also differ from prior art lenses of FIGS. 1, 2A and 2B because they have an optically flat surface. As shown in FIG. 4E, the original optically flat surface 100a may be replanarized by the chemical mechanical polishing to a slight extent, and a new optically flat surface 100b of the transparent substantially inorganic support layer 100 formed. The optically flat lens surfaces 130a of the lenses 132 lie coplanar with the optically flat surface 100b. When viewed from above, as shown in FIG. 4F, the inverted lenses 132 lie in a planar array 180 of half cylinders and are spatially substantially contiguous. The planar array 180 is shown having cross-section AA and cross-section BB.

Turning now to FIGS. 5A through 5D, a second embodiment of the present invention is shown which further includes an overlying array of convex cylindrical lenses disposed perpendicularly to the planar array 180 of inverted cylindrical lenses 132. The use of a single array of convex cylindrical lenses is well know in the art to be advantageous for imagers with photodiodes whose length and width differ substantially, as taught for example by Ishihara, U.S. Pat. No. 4,667,092. However, single arrays of cylindrical lenses have not found wide application in imagers with square pixels, especially for small pixels.

Figure 5A:
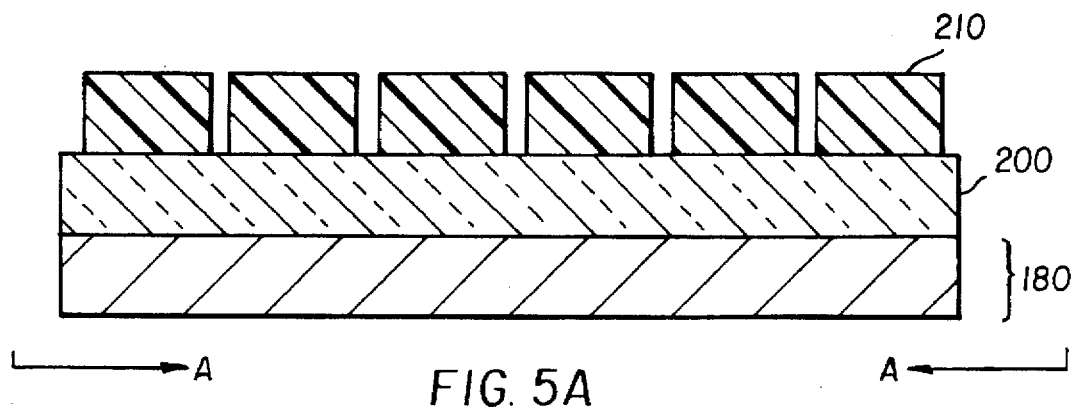
FIGS. 5A–5D are schematic cross-sectional views of a solid state imager made in accordance with this invention in which an overlying array of convex cylindrical lenses is disposed perpendicularly to the planar array of cylindrical lenses.
Figure 5B:
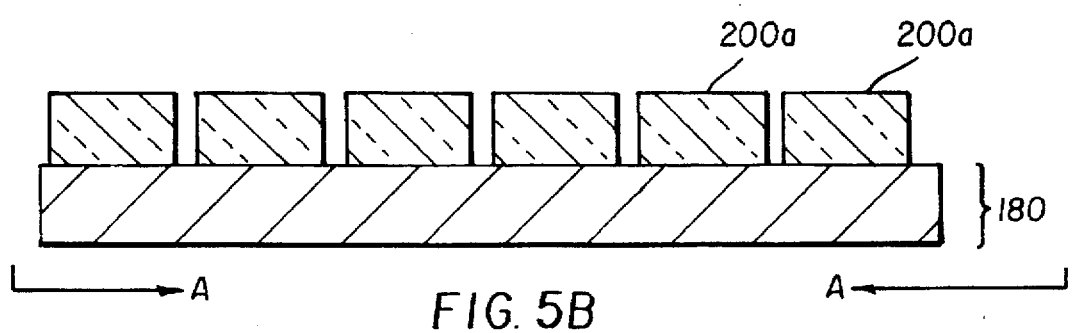
Figure 5C:
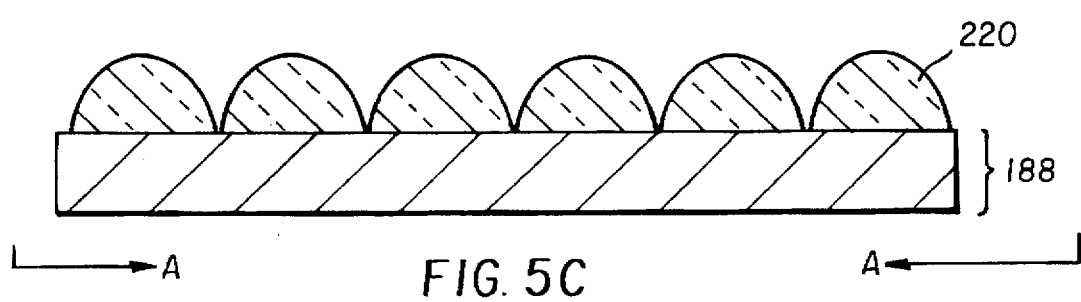

Therefore, in accordance with the second embodiment of the present invention, a second array of convex cylindrical lenses 220 is formed on top of the planar array 180 of inverted cylindrical lenses 132 (as shown in FIG. 5C). The direction of the convex cylindrical lenses 220 in the second array is substantially perpendicular to the direction of the inverted cylindrical lenses 132, that is, perpendicular to cross-section BB and along cross-section AA as shown in FIG. 4F. The convex cylindrical lenses 220 formed on top of planar array 180 are preferably made from either organic or inorganic materials and are formed by thermal deformation of patterned strips of these materials. A preferred inorganic material is a low melting glass with a glass transition temperature less than 500° C. A preferred organic material is comprised of a substantially transparent polymer, for example, a polymer selected from the group photoresist, polymethyl methacrylate, polyimide, and polycarbonate, as is well known in the art.

FIGS. 5A through 5C depict cross-section AA of the planar array 180. Referring to FIG. 5A, a low melting glass layer 200 is uniformly deposited on the planar array 180 of inverted cylindrical lenses 132. A conventional photoresist layer 210 is patterned over the glass layer 200 to form narrowly spaced strips 200a. As shown in FIG. 5B, the pattern is then transferred to the low melting glass layer 200 by etching, preferably reactive ion etching, and the photoresist layer 210 is removed. The low melting glass layer 200 is preferably an oxide glass or a sol gel with a glass transition temperature less than 500° C. so that the low melting glass layer 200 can be reflowed to form lenses at a temperature compatible with material layers such as aluminum frequently present in the underlying solid state imager (not shown) and with the transparent substantially inorganic support layer 100 and the substantially inorganic lens material 130 which comprise the underlying planar array 180. It is also preferable that the glass transition temperature be greater than about 200° C. so that the final devices can be subjected to sustained temperatures without deterioration of the shape or optical properties of the lens arrays, such temperatures being used for operations such as sterilization.

Figure 5D:
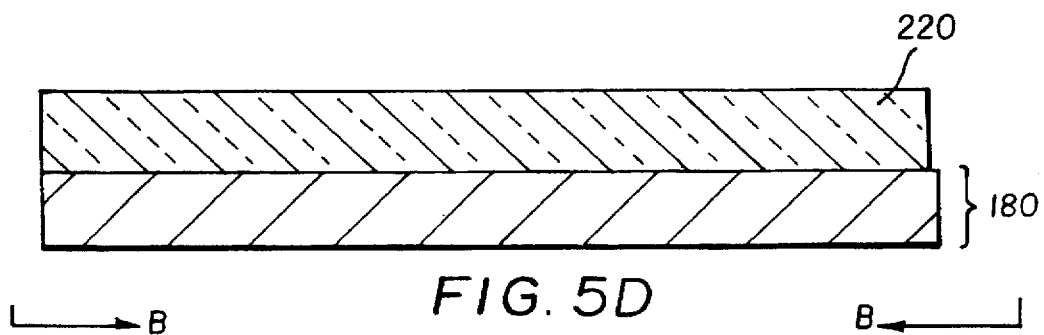

Referring now to FIG. 5C, after etching the low melting glass layer 200, and removing the photoresist layer 210, the low melting glass layer 200 patterned into narrowly spaced strips 200a is reflowed to form convex cylindrical lenses 220 having bottom surfaces 220a in contact with the optically flat lens surface 130a of the planar array 180. FIG. 5D shows the same structure as FIG. 5C, but in cross-section BB in a region of the maximum height of the convex cylindrical lenses 220. The combination of the two cylindrical lens arrays, that is, planar array 180 and the second array of convex cylindrical lenses 220, disposed at substantially right angles to one another, results in an increase in the number of incident light rays directed towards the photodiodes 14 in the underlying semiconductor portion 40 (not shown), which is assumed to underlie the planar array 180. This increase occurs because the light rays are refracted in one direction by the convex cylindrical lenses 220 and then again in a direction perpendicular to the first direction by the planar array 180 of inverted cylindrical lenses. Convex cylindrical lenses 220 may also be made from an organic material although this limits the temperature to which the imager may be heated and limits the range of index of refraction of cylindrical lenses 220, as is well known in the art.

Figure 1:
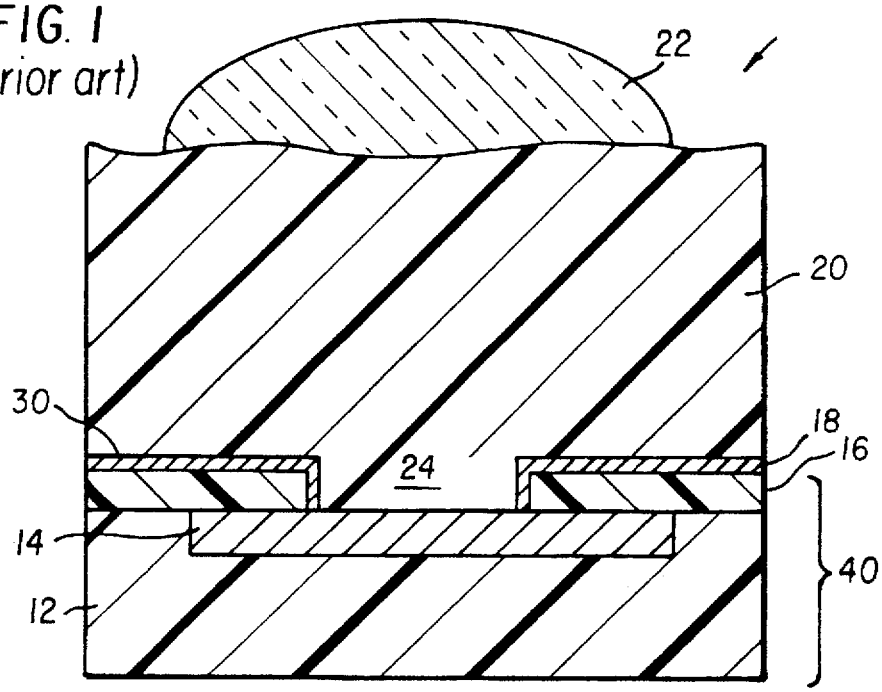
FIG. 1 is a partial schematic cross-sectional view of a prior art imager.
Figure 2A:
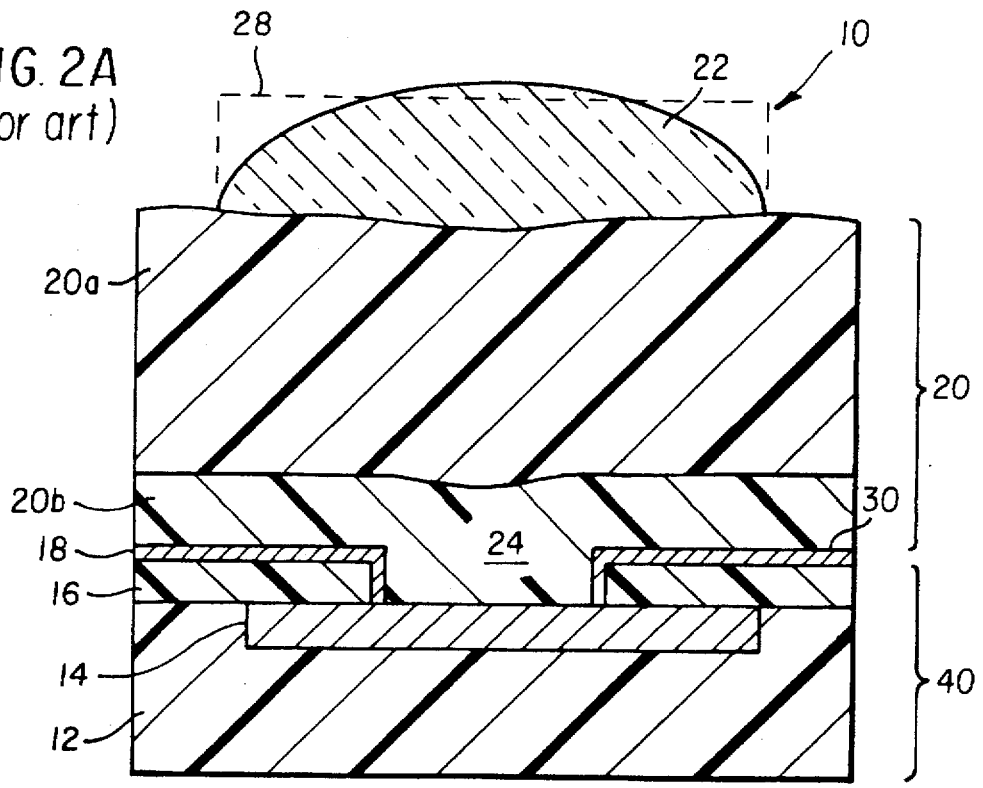
FIGS. 2A and 2B are partial schematic cross-sectional views of a prior art imager having upper and lower spacer layers.
Figure 2B:
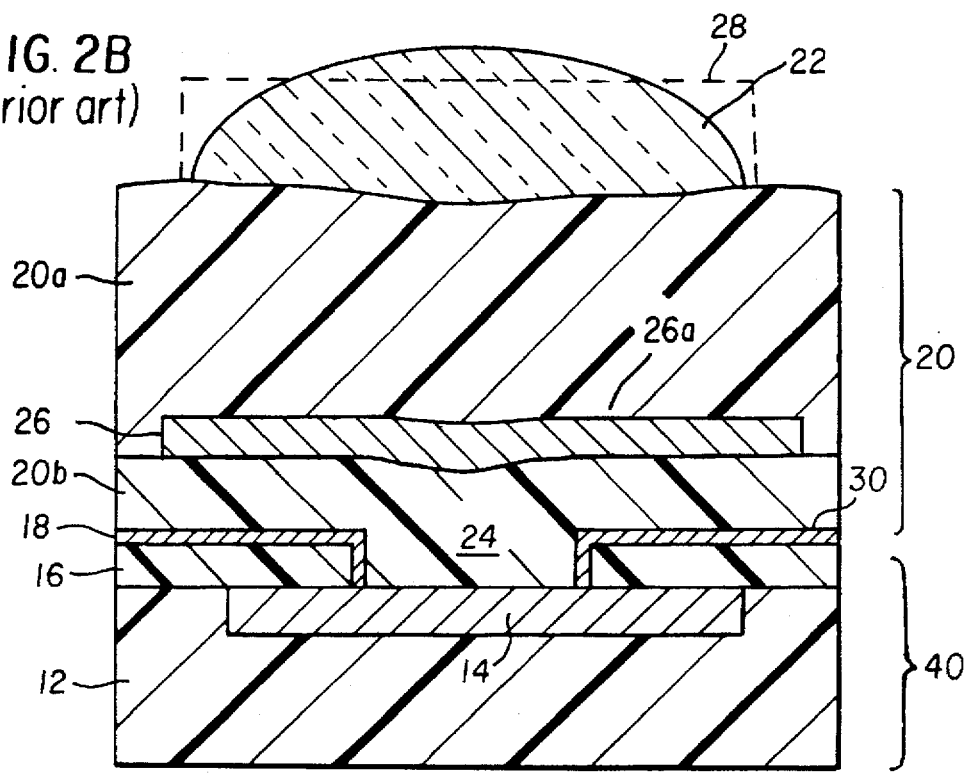
Figure 3A:
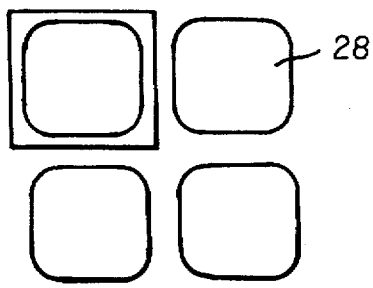
FIGS. 3A–3B are top views of a prior art lens.
Figure 3B:
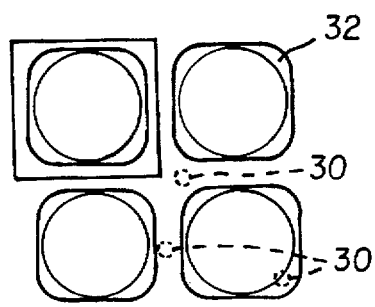
Figure 5F:
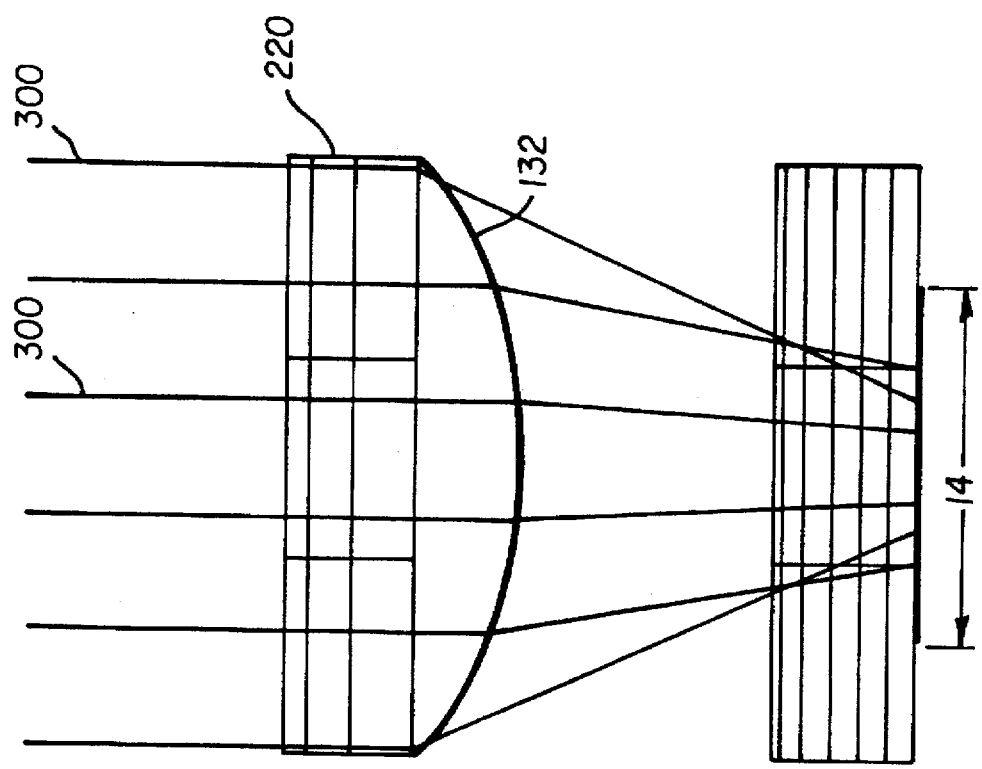
FIGS. 5E–5I show the results of ray tracing computer calculations which demonstrate an advantage of the present invention.
Figure 5E:
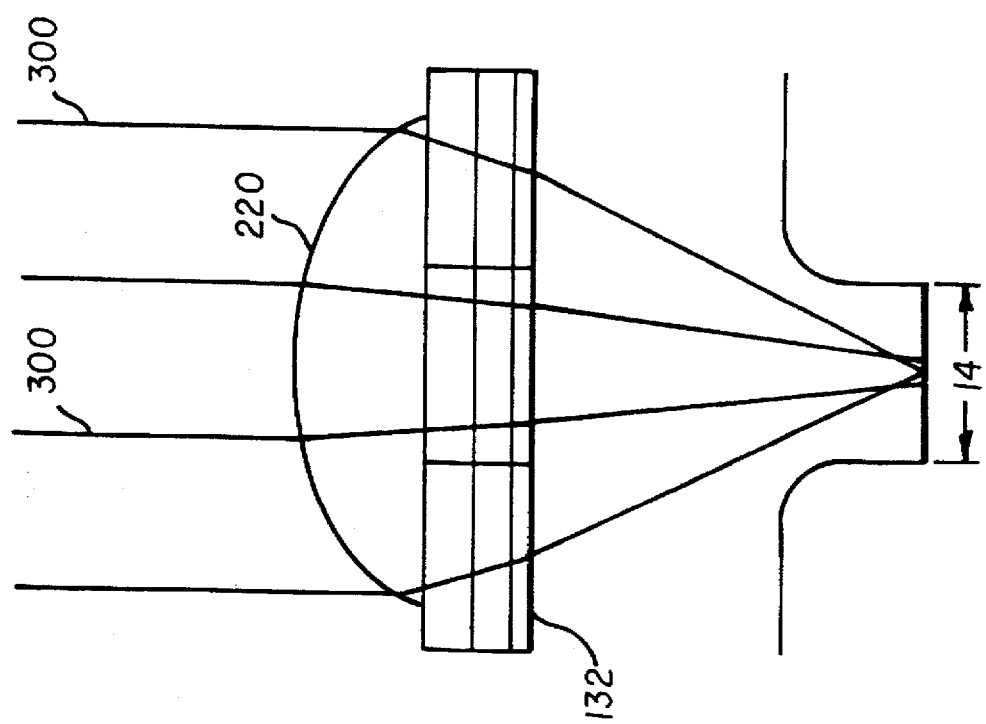

Calculations on the reflections of rays made by applying the well known equations for the refraction of light at the interface between materials of different indices of refraction are shown in FIGS. 5E and 5F. In FIG. 5E, the cross-section AA is shown, similar to FIG. 5C. A set of incident rays 300 are shown refracted by convex cylindrical lenses 220 and by lens 132 of planar array 180 (not shown) made from substantially inorganic lens materials 130 (not labeled). The rays are refracted into photodiodes 14. In FIG. 5F, the cross-section BB is shown, similar to FIG. 5D. The set of incident rays 300 are shown refracted into photodiodes 14 by convex cylindrical lenses 220 and by lens 132. The rays are less tightly focused when viewed in this cross-section because the incident rays are more widely spaced. FIGS. 5E and 5F illustrate quantitatively how both convex cylindrical lenses 220 and lens 132 assist in directing rays towards photodiodes 14. In these figures, the repeat distance of the convex cylindrical lenses 220 and of lenses 132 is taken to be 5.0 microns, as is the size of the pixel 10 (FIG. 1). The dimension of photodiode 14 as seen in cross-section in FIG. 5E is 1.66 microns, and the dimension of photodiode 14 as seen in cross-section in FIG. 5D is 3.33 microns, which is typical of the dimensions of the photodiodes of interline imagers as currently practiced. The spaces between the lenses are 0.7 and 0.0 microns in cross-sections AA and BB of FIGS. 5C and 5D, respectively. The indices of the lens materials are taken to be 2.4 for the array 180 of lenses and 1.6 for the convex cylindrical lenses 220.

Figure 5G:
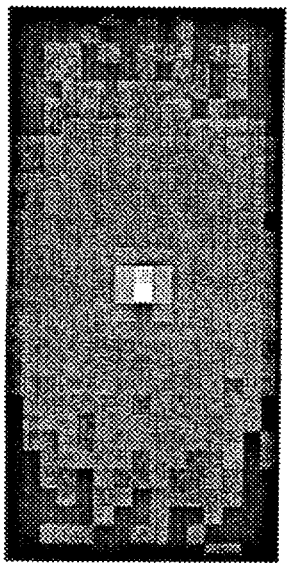
Figure 5H:
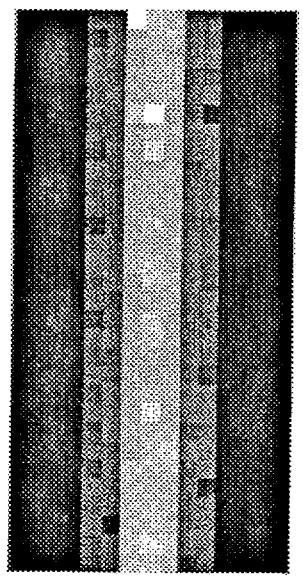
Figure 5I:
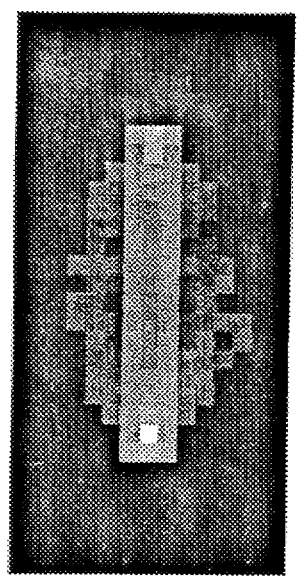

The results of computer generated calculations similar to those shown in FIGS. 5E and 5F using a random distribution of 10,000 rays are shown in FIGS. 5G, 5H, and 5I, in which the dark rectangle represents the top view of photodiode 14 (FIG. 5E). The light squares represent the number of rays reaching a particular region of the photodiode and the numerical percentage of rays reaching the photodiode (Quantum Efficiency) is given above each figure by the label "QE". This percentage is reduced from 100% because not all rays are refracted into the photodiode and because a fraction of each ray is lost by reflection at the interfaces between materials with different indices of refraction, as is well known in the art. FIG. 5G shows calculated results for the case of cross cylindrical lenses as taught in the present invention. The Quantum Efficiency is 53%. FIG. 5H shows calculated results for the case in which the array 180 of lenses has been removed, as would be the case corresponding to prior art convex cylindrical lenses. These focus the light in only one direction. The Quantum Efficiency is 33%. FIG. 5G shows calculated results for the case of prior art 5.0 micron square lenses, with 0.7 μm gaps between lenses, which refract light in both directions. The Quantum Efficiency is 41%. Therefore, quantitatively there is seen to be a gain in the fraction of rays that are directed toward the photodiode 14 for the device taught in the present invention.

It is to be appreciated that while the embodiment discussed in FIGS. 5A–5D has been described in terms of convex cylindrical lenses 220 made of a low melting point glass, it may be preferable in some cases for reasons of cost or thermal processing budget to form cylindrical lenses 220 over optically planar array 180 using an organic material, such as a substantially transparent polymer. A substantially transparent polymer can comprise, for example, a polymer selected from the group photoresist, polymethyl methacrylate, polyimide, and polycarbonate, as is well known in the art.

FIGS. 6A through 6H show a third embodiment of the present invention in which the method of patterning the low melting glass layer 200 is advantageously chosen to provide very narrow gaps between the convex cylindrical lenses 220 to ensure that a maximum number of incident light rays are directed to their associated photodiodes 14 in the underlying semiconductor portion 40 with a minimum number of light rays incident on the gap.

Figure 6A:
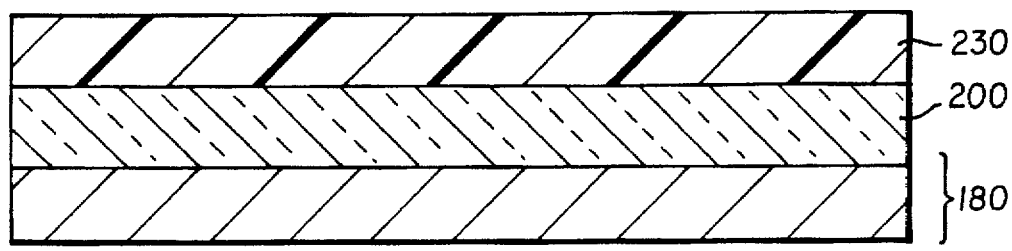
FIGS. 6A–6H are schematic cross-sectional views of a solid state imager made in accordance with this invention in which very narrow gaps are present between the convex cylindrical lenses.
Figure 6B:
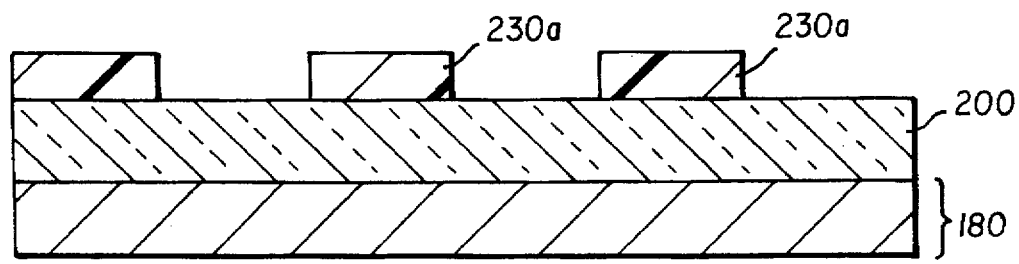
Figure 6C:
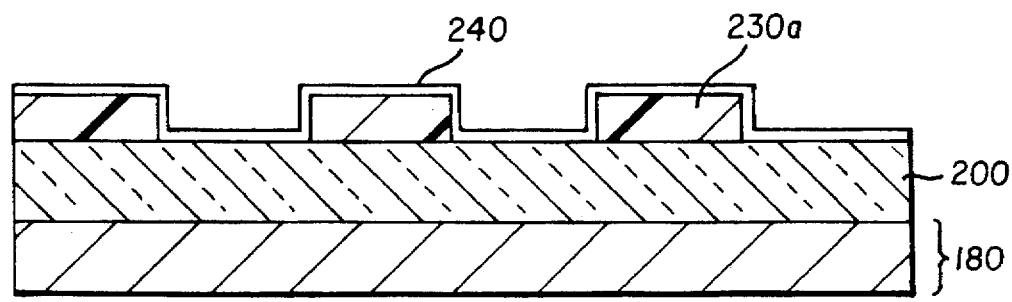
Figure 6D:
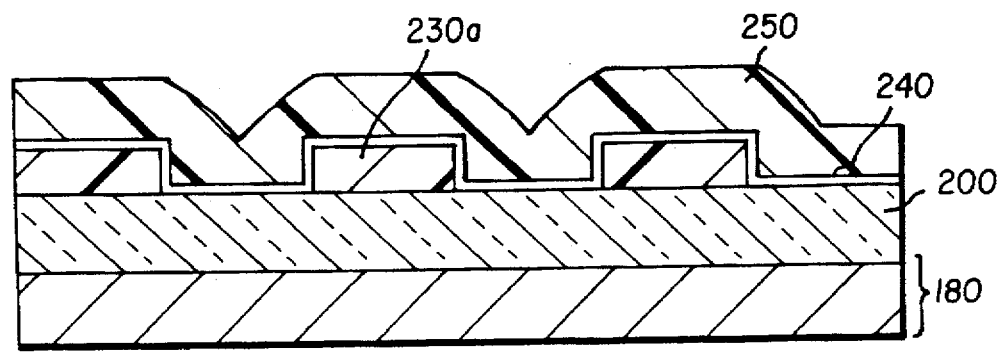

Referring to FIG. 6A, a first patterning layer 230 is formed on the low melting glass layer 200 that is deposited on the planar array 180. The first patterned layer 230 is preferably formed of a material such as polysilicon, which is an etch-stop for a low melting glass layer 200. As shown in FIG. 6B, the first patterning layer 230 is then defined into first patterning strips 230a by exposing conventional photoresist over the first patterning layer 230, followed by etching, preferably reactive ion etching. At least one edge of the first patterning strips 230a overlies the location on the low melting glass layer 200 that is desired to be etched. Next, as shown in FIG. 6C, a conformal spacer layer 240, preferably an oxide or a nitride, is deposited on the first patterning strips 230a and on the surface of the low melting glass layer 200. A second patterning layer 250, being preferably the same material as the first patterning layer 230, is deposited on the conformal spacer layer 240, as shown in FIG. 6D.

Figure 6E:
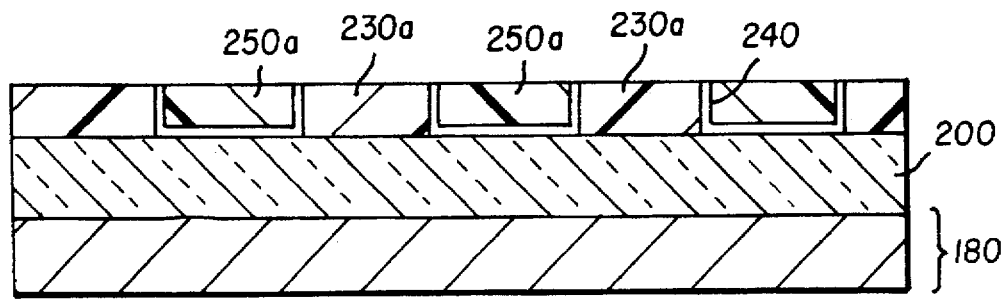

Referring now to FIG. 6E, the second patterning layer 250 is planarized, preferably by chemical mechanical polishing, to the extent that it is removed from those regions overlying the first patterning strips 230a and additionally to the extent that the conformal spacer layer 240 is removed from the tops of the first patterning strips 230a, thereby forming second patterning strips 250a. As shown in FIG. 6E, a series of alternate rectangular regions of the materials is provided comprising the first and second patterning strips 230a and 250a with the conformal spacer layer 240 disposed between the first and second patterning strips 230a and 250a. In the case of the preferred materials being oxide for the conformal spacer layer 240 and polysilicon for the first and second patterning strips 230a and 250a, the results in FIG. 6E are preferably accomplished by chemical mechanical polishing using a single silica slurry, or by two stages of chemical mechanical polishing using slurries which etch first polysilicon and then oxide, as is well known in the art.

Figure 6F:
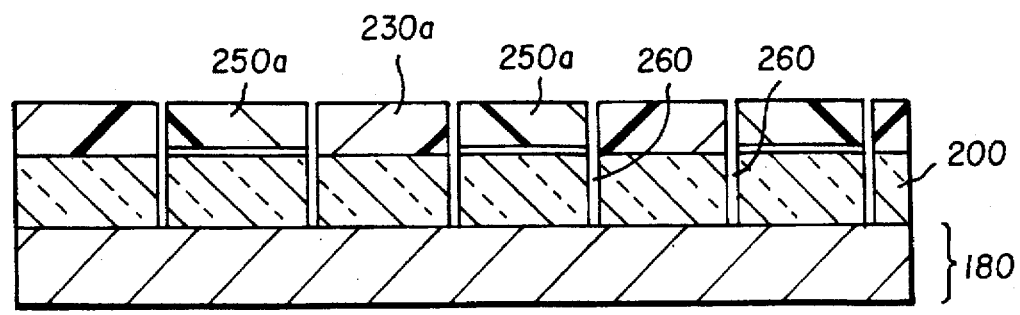
Figure 6G:
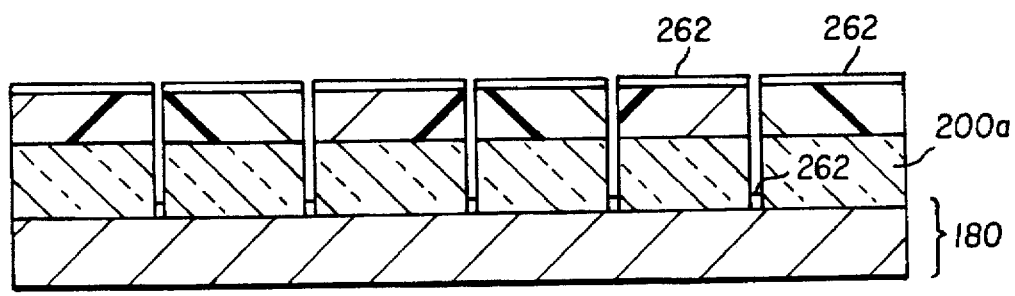

Referring to FIG. 6F, an anisotropic etch, preferably a reactive ion etch using gases such as $CHF_3$, is next used to etch the conformal spacer layer 240 and the low melting glass layer 200, thereby forming openings 260. The etch depth is preferably equal to the thickness of the low melting glass layer 200, but etches deeper than this can also be advantageous. The etching forms the low melting glass layer into narrowly spaced glass strips 200a. As shown in FIG. 6G, at this stage of processing, a light shield material 262 can be optionally deposited by non-conformal deposition of a metal, preferably by evaporation, into the openings 260 in the low melting glass layer 200 and on the surfaces of the first and second patterning strips 230a and 250a. The metal is preferably chosen from the group tungsten, tungsten silicide, titanium, and titanium silicide. Since the light shield material 262 lies in the openings 260, rays of light which would not be otherwise refracted are blocked or partially blocked, so as not to fall in unwanted regions of the underlying solid state imager (not shown).

Figure 6H:
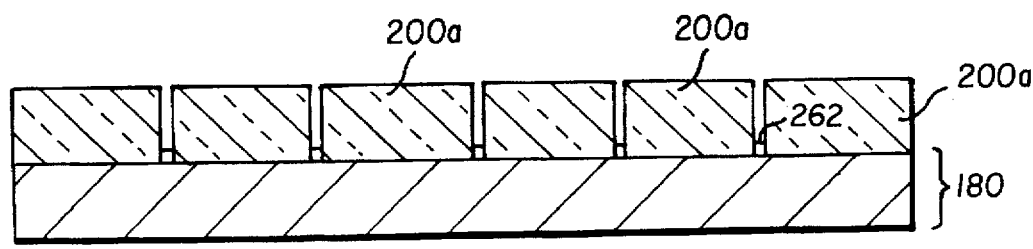

Referring to FIG. 6H, at this stage of fabrication, the first and second patterning strips 230a and 250a and light shield material 262 on top of patterning strips 230a and 250a are removed by polishing, thereby forming structures similar to those shown in FIG. 5B, appropriate for subsequent lens formation as described in association with FIGS. 5C and 5D, namely after removing the first and second patterning strips 230a and 250a, the narrowly spaced glass strips 200a are then reflowed by heating the entire structure to form convex cylindrical lenses (not shown). h this method, it is to be appreciated that the openings 260 can be substantially smaller than the minimum lithographic feature size, being defined only by the thickness of the deposited conformal spacer layer 240, thereby providing the smallest possible spacing between lenses subsequently formed by thermal reflow.

Figure 7A:
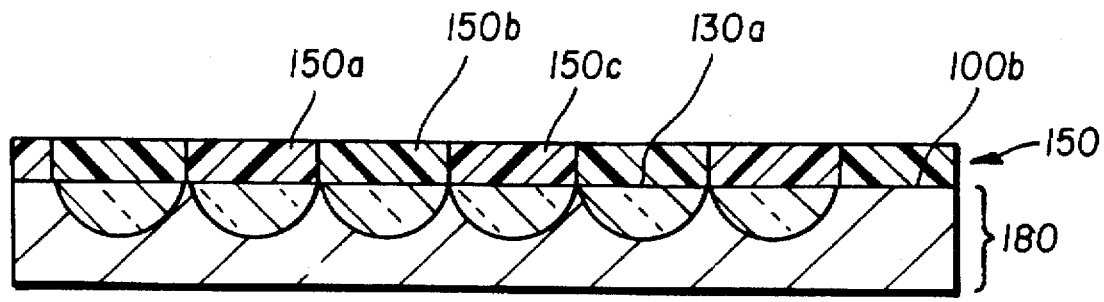
FIGS. 7A and 7B are schematic cross-sectional views of a solid state imager made in accordance with this invention in which a color filter array comprised of color filter elements is provided directly on the planar array.
Figure 7B:
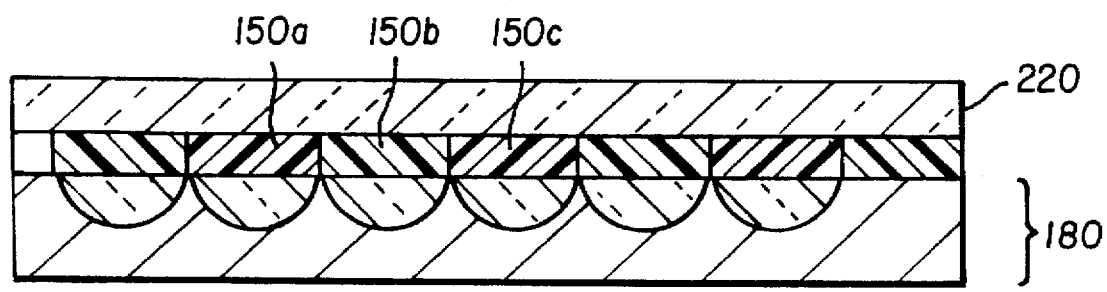

Referring now to FIGS. 7A and 7B, a fourth embodiment of the present invention is disclosed in which a color filter array comprised of color filter elements is provided directly on the planar lens array 180. Referring to FIG. 7A, a color filter array 150 is shown, comprised of first, second, and third color filter elements 150a, 150b, and 150c which transmit different portions of the visible spectrum. The color filter array 150 is formed on the optically flat surface 100b and the optically flat lens surfaces 130a, in registry with the lens and hence with the underlying photodiodes (not shown). The process of application is well known in the art and is taught, for example, by Nomura, U.S. Pat. No. 5,321,249, which describes a spin on coating technique on a material not containing lenses. It is to be appreciated that the light ray refractory properties associated with the lenses in accordance with the present invention are not severely reduced upon overcoating with organic polymer materials such as, but not limited to, the color filter materials described by Nomura in the above referenced patent. This is because the use of inorganic materials to form the lenses allows a choice of the lens refractive index that is substantially higher, for example, in the range of from 1.6 to 2.4 for the group of preferred substantially inorganic lens materials cited above, than is the choice of index afforded by organic polymers, whose indices typically lie in the range of from 1.4 to 1.6, as is well known in the art. It is also to be appreciated that the planarity of the optically flat lens surfaces 130a with the optically flat surface 100b of the transparent substantially inorganic support layer, as well as the fact that these surfaces are insoluble, simplify the process of forming overlying color filters and is advantageous for uniform spectral transmission characteristics of the color filters elements.

After formation of the color filter array 150, an array of upper cylindrical lenses is formed in a manner identical to that described in association with either FIGS. 5A through 5D or FIGS. 6A through 6H. In the case that the color filter array 150 cannot be heated excessively, for example above approximately 300° C., the array of convex cylindrical lenses 220 need to be made of organic material. In the case that the color filter array 150 can be heated extensively, for example above temperatures of 400° C. for many minutes, then the array of convex cylindrical lenses 220 may be advantageously formed from inorganic material such as a low melting temperature glass. The structure after such provision is shown in FIG. 7B, and is comprised of first, second, and third color filter elements 150a, 150b, and 150c overcoated by the array of cylindrical lenses 220 oriented substantially perpendicularly to the first planar array 180. Because of the thickness of the intervening color filter array 150, the curvature of the upper array of cylindrical lenses 220 can in general be chosen differently than for the case with no intervening color filter array, as is well known in the art.

It is to be appreciated that in embodiments, such as the second embodiment, in which the array of convex cylindrical lenses 220 as well as the planar array 180 are made from substantially inorganic materials, that polymeric overlayers, such as passivation layers of polyimides, packaging materials such as epoxy resins, or even single layer color filters, can be coated without destroying the ability of the lenses to direct incident light into photodiodes. This is because the use of inorganic materials to form the lenses allows a choice of the lens refractive index that is substantially higher, as was discussed previously.

It is also to be appreciated that the present invention has been described with reference to specific detailed embodiments and that may related variations are possible, including variants of materials selected, which will be obvious to those skilled in the art.

PARTS LIST
10 image pixel
12 semiconductor substrate
14 photodiode
16 electrode
18 light shield
20 lens supporting layer
20a upper spacer layer
20b lower spacer layer
22 lens
24 aperture
26 color filter element
28 photoresist islands
30 blocked light ray
32 corner regions
40 semiconductor portion
100 transparent substantially inorganic support layer
100a optically flat surface
100b optically flat surface
110 etch-stop layer 114 openings
116 bridge sections
118 isolated central regions
119 region
120 depressions
130 substantially inorganic lens material
130a optically flat lens surface
132 lenses
150 color filter array
150a first color filter element
150b second color filter element
150c third color filter element
180 planar array
200 low melting glass layer
200a narrowly spaced glass strips
210 photoresist layer
220 convex cylindrical lenses
220a bottom surface
230 first patterning layer
230a first patterning strips
240 conformal spacer layer
250 second patterning layer
250a second patterning strips
260 openings
262 light shield material
300 rays

We claim:

1. A method of making an imager, comprising the steps of:
   (a) providing a semiconductor substrate having a top surface;
   (b) providing a plurality of spaced image pixels in the substrate, thereby forming a semiconductor portion;
   (c) depositing a first transparent substantially inorganic support layer over the semiconductor portion;
   (d) making the inorganic support layer optically planar by chemical mechanical polishing, thereby forming an optically flat top surface;
   (e) forming a plurality of depressions in the optically flat top surface;
   (f) uniformly depositing a substantially inorganic lens material on the optically flat top surface, entirely filling the depressions; and
   (g) making the substantially inorganic lens material optically planar by chemical mechanical polishing, thereby forming an optically planar lens surface.

2. The method of claim 1 further including:
   (h) uniformly depositing a low melting glass layer on the optically planar lens surface;
   (i) patterning the low melting glass layer into narrowly spaced strips; and
   (j) reflowing the narrowly spaced strips by heating the entire structure to form convex cylindrical lenses.

3. The method of claim 2 further including:
   (h1) uniformly depositing a substantially transparent polymer on the optically planar lens surface;
   (i1) patterning the substantially transparent polymer into narrowly spaced strips; and
   (j1) reflowing the narrowly spaced strips by heating the entire structure to form convex cylindrical lenses.

4. A method of making an imager, comprising the steps of:
   (a) providing a semiconductor substrate having a top surface;
   (b) providing a plurality of spaced image pixels in the substrate, thereby forming a semiconductor portion;
   (c) depositing a first transparent substantially inorganic support layer over the semiconductor portion;
   (d) making the inorganic support layer optically planar by chemical mechanical polishing, thereby forming an optically flat top surface;
   (e) forming a plurality of depressions in the optically flat top surface;
   (f) uniformly depositing a substantially inorganic lens material on the optically flat top surface, entirely filling the depressions;
   (g) making the substantially inorganic lens material optically planar by chemical mechanical polishing, thereby forming an optically planar lens surface;
   (h) uniformly depositing an low melting glass layer on the optically planar lens surface;
   (i) depositing a first patterning layer on the low melting glass layer;
   (j) etching the first patterning layer to form first patterning strips;
   (k) depositing a conformal spacer layer on the first patterning strips;
   (l) uniformly depositing a second patterning layer on the conformal spacer layer;
   (m) removing entirely the second patterning layer from over the first patterning strips to form second patterning strips and to expose portions of the conformal spacer layer;
   (n) etching the exposed portions of the conformal spacer layer to form openings between the first and second patterning strips;
   (o) further etching the low melting glass layer under the openings to form narrowly spaced glass strips;
   (p) removing the first and second patterning strips and then the remaining portion of the conformal spacer layer; and
   (q) reflowing the narrowly spaced glass strips by heating the entire structure to form convex cylindrical lenses.

5. The method of claim 4 further including after step (o):
   (p2) depositing an opaque light shield material;
   (q2) removing the first and second patterning strips, the remaining portion of the conformal spacer layer, and that portion of the light shield material on the first and second patterning strips; and
   (r2) then reflowing the narrowly spaced glass strips by heating the entire structure to form cylindrical lenses.

\* \* \* \* \*